US009548723B1

United States Patent
Viviani et al.

(10) Patent No.: US 9,548,723 B1
(45) Date of Patent: Jan. 17, 2017

(54) CURRENT MODE DVR OR PVCOM WITH INTEGRATED IMPEDANCES

(71) Applicant: IML International, Grand Cayman (KY)

(72) Inventors: Alberto Giovanni Viviani, Mountain View, CA (US); ChinFa Kao, Taipei (TW); Chiayao S. Tung, Cupertino, CA (US)

(73) Assignee: IML International, Grand Cayman (KY)

( * ) Notice: Subject to any disclaimer, the term of this patent is extended or adjusted under 35 U.S.C. 154(b) by 0 days.

(21) Appl. No.: 14/918,299

(22) Filed: Oct. 20, 2015

Related U.S. Application Data

(63) Continuation of application No. 14/685,532, filed on Apr. 13, 2015, now Pat. No. 9,166,566, which is a continuation of application No. 13/783,174, filed on Mar. 1, 2013, now Pat. No. 9,007,098.

(51) Int. Cl.
*H03K 3/00* (2006.01)
*H03K 3/01* (2006.01)

(52) U.S. Cl.
CPC ...................................... *H03K 3/01* (2013.01)

(58) Field of Classification Search
None
See application file for complete search history.

(56) References Cited

U.S. PATENT DOCUMENTS

| 6,507,223 B2 * | 1/2003 | Felder ................. H03F 3/45955 326/82 |
| 7,256,638 B2 * | 8/2007 | Vice ......................... H02J 3/01 327/110 |
| 8,446,173 B1 * | 5/2013 | Faucher ........... H03K 19/00361 326/27 |
| 9,007,098 B1 | 4/2015 | Viviano et al. |
| 9,166,566 B1 * | 10/2015 | Viviani ............... G09G 3/3614 |
| 2004/0207375 A1 | 10/2004 | Umemoto et al. |
| 2005/0146322 A1 | 7/2005 | Hoffman et al. |
| 2007/0296456 A1 * | 12/2007 | van der Goes .... H03K 19/0005 326/30 |
| 2008/0093659 A1 | 4/2008 | Voegeli et al. |
| 2009/0111397 A1 * | 4/2009 | Dunsmore ............ H03F 1/0227 455/108 |
| 2011/0187757 A1 | 8/2011 | Yang et al. |

(Continued)

OTHER PUBLICATIONS

AND8416/D "The CAT5132 Used for VCOM Buffer Control in a TFT LCD Display," On Semiconductor, Former Catalyst Document No. AN28, Aug. 2009, 5 pages.

(Continued)

*Primary Examiner* — Lincoln Donovan
*Assistant Examiner* — Khareem E Almo
(74) *Attorney, Agent, or Firm* — Aka Chan LLP

(57) ABSTRACT

One or more resistors or resistances are integrated in a 7-bit DVR or PVCOM integrated circuit. A 7-bit DVR or PVCOM integrated circuit includes a 7-bit DAC. The integrated resistors or resistances (R1, R2, or RSET, or any combination) reduces the number of external components, reduces the number of pins, and increases the accuracy of the DVR or PVCOM circuit. The least significant bit (LSB) of the DAC depends only on ratios of internal resistors, which can be made very accurate and independent of temperature.

20 Claims, 2 Drawing Sheets

(56) References Cited

U.S. PATENT DOCUMENTS

2013/0021183 A1    1/2013  Ashburn et al.
2013/0135285 A1    5/2013  Lee et al.

OTHER PUBLICATIONS

MAX1735 "Multi-Output DC-DC Power Supply with VCOM Amplifier and Temprature Sensor for E-Paper Applications," Maxim Integrated Products, 19-5881, Rev 2, May 2012, 24 pages.
MAX9650/MAX9651 "High-Current VCOM Drive Op Amps for TFT LCDs," Maxim Integrated Products, 19-4187, Rev. 5, Nov. 2012, 13 pages.
MAX9669 "10-Bit Programmable Gamma Reference System with MTP for TFT LCDs," Maxim Integrated Products, 19-4326, Rev. 4, Aug. 2011, 23 pages.
TPS65100, TPS65101, TPS65105 "Triple Output LCD Supply with Linear Regulator and VCOM Buffer," Texas Instruments, SLVS496C, Sep. 2003, Revised Apr. 2006, 32 pages.

\* cited by examiner $$V_{COM} = V_{AVDD} \times \frac{R_1}{R_1 + R_2} \times (1 - \frac{N \times R_1}{127 \times 20 \times R_{SET}})$$ Figure 3A

| AVDD | 12.2 | V |
|---|---|---|
| R1 | 50 | kohm |
| R2 | 100 | kohm |
| Vcom(max) | 8.1 | V | ← 0.677*AVDD

| Rset(kohm) | 1 | 3 | 5 | 7.5 | 10 | 12.5 | 15 | 20 |
|---|---|---|---|---|---|---|---|---|
| Vcom_min(V) | 0.0 | 1.4 | 4.1 | 5.4 | 6.1 | 6.5 | 6.8 | 7.1 |
| Resolution(mV) | 64 | 53 | 32 | 21 | 16 | 13 | 11 | 8 |
| IRSET_max(uA) | 244 | 203 | 122 | 81 | 61 | 49 | 41 | 31 |

▨ default

CURRENT MODE DVR OR PVCOM WITH INTEGRATED IMPEDANCES

CROSS-REFERENCE TO RELATED APPLICATIONS

This patent application is a continuation of U.S. patent application Ser. No. 14/685,532, filed Apr. 13, 2015, issued as U.S. Pat. No. 9,166,566 on Oct. 20, 2015, which is a continuation of U.S. patent application Ser. No. 13/783,174, filed Mar. 1, 2013, issued as U.S. Pat. No. 9,007,098 on Apr. 14, 2015, which is incorporated by reference along with all other references cited in this application.

BACKGROUND OF THE INVENTION

The invention is related to the field of electrical circuits and more specifically to driver circuitry for display panel products.

Electronic visual displays are used in a wide range of applications including computer monitors, televisions, instrument panels, aircraft cockpit displays, and signage. They are common in consumer devices such as laptop computers, video players, music players, gaming devices, clocks, watches, calculators, telephones, smartphones, tablets, and many other devices.

Some examples of display panel technologies include liquid crystal displays (LCDs), organic led emitting diode (OLED) displays, and plasma displays. Such displays operate according to various principles. For example, LCDs use the light modulating properties of liquid crystals to produce images. Since LCDs do not emit light, there is often a backlight behind the LCD panel to illuminate the display. Other display technologies work according to different principles.

Electronics are used to drive an electronic display. These electronics provide power and electrical input. For example, there are voltages for the row and column drivers to drive a thin-film transistor (TFT) LCD. Electronics generate voltage waveforms to achieve (1) color output stability to alleviate flickering and inconsistent color, and (2) liquid crystal stability to prevent display damage due to localized net voltage build-up.

Further, a LCD display panel has a VCOM input. VCOM is adjusted to match the capacitance and performance specifications of the TFT panel to maximize contrast and minimize flickering. The VCOM can be a programmable function, which can be used to adjust a panel to maximize contrast, minimize flickering during operation, and optimize panel performance.

It is desirable to improve electronics used to drive electronic visual displays, so that these displays and the electronics used to drive them to improve performance, reduced cost, and reduce power consumption. Therefore, improved electronics and circuits are needed.

BRIEF SUMMARY OF THE INVENTION

A current mode digitally variable resistor (DVR) or programmable VCOM (PVCOM) circuit, or both, has integrated resistors, a programmable current setting resistor, and improved accuracy. One or more resistors or resistances are integrated in a 7-bit DVR or PVCOM integrated circuit. A 7-bit DVR or PVCOM integrated circuit includes a 7-bit DAC. The integrated resistors or resistances (R1, R2, or RSET, or any combination) reduces the number of external components, reduces the number of pins, and increases the accuracy of the DVR or PVCOM circuit. The least significant bit (LSB) of the DAC depends only on ratios of internal resistors, which can be made very accurate and independent of temperature.

In an implementation, to provide flexibility to the customer, the current setting resistor for the DAC is programmable. For example, the customer can choose between several different values, maintaining the flexibility of the external approach. The 7-bit DVR or PVCOM solution with integrated resistors or resistances is compatible with the machines used currently in production for LCD panels.

In a specific implementation, a device includes: a 7-bit digital-to-analog (DAC) converter circuit formed on a semiconductor substrate of an integrated circuit; a first operational amplifier circuit, formed on the semiconductor substrate, comprising a first input connected to the 7-bit digital-to-analog converter circuit; and a second operational amplifier circuit, formed on the semiconductor substrate, comprising a first input connected to an output of the second operational amplifier circuit and a voltage output of the integrated circuit.

The device further includes: a first internal resistance, formed on the semiconductor substrate, connected between a first supply voltage and a voltage bias node; a second internal resistance, formed on the semiconductor substrate, connected between the voltage bias node and a second supply voltage line, wherein the voltage bias node is connected to a second input of the second operational amplifier circuit; a transistor, formed on the semiconductor substrate, connected between the voltage bias line and a second input of the first operational amplifier circuit; and a third internal resistance, formed on the semiconductor substrate, connected between the second input of the first operational amplifier circuit and the second supply voltage line.

In various implementations, the third internal resistance is electrically programmable in a range from about 1000 ohms to about 20 kiloohms. The first internal resistance has a value of about 50 kiloohms. The first internal resistance has a value of about 100 kiloohms. The first supply voltage has a value about 12 volts. The first, second, or third internal resistances, or any combination, are programmable to have a plurality of resistance values A connection to the third internal resistance is not made available via an external pin to the integrated circuit. A connection to the second input node of the second operational amplifier circuit is not made available via an external pin to the integrated circuit. A connection to an output of the 7-bit digital-to-analog converter circuit is not made available via an external pin to the integrated circuit.

The first input of the first operational amplifier circuit is a positive input. The first input of the second operational amplifier circuit is a negative input.

In a specific implementation, a method includes: forming a 7-bit digital-to-analog (DAC) converter circuit on a semiconductor substrate of an integrated circuit; forming a first operational amplifier circuit on the semiconductor substrate, the first operational amplifier including a first input coupled to the 7-bit digital-to-analog converter circuit; forming a second operational amplifier circuit on the semiconductor substrate, the second operational amplifier including a first input connected to an output of the second operational amplifier circuit and a voltage output of the integrated circuit; forming a first internal resistance on the semiconductor substrate; and connecting the first internal resistance between a first supply voltage and a voltage bias node.

The method further includes: forming a second internal resistance on the semiconductor substrate; connecting the second internal resistance between the voltage bias node and a second supply voltage line; connecting the voltage bias node a second input of the second operational amplifier circuit; forming a transistor on the semiconductor substrate; connecting the transistor between the voltage bias line and a second input of the first operational amplifier circuit; forming a third internal resistance on the semiconductor substrate; and connecting the third internal resistance between the second input of the first operational amplifier circuit and the second supply voltage line.

In various implementations, the method can includes: electrically programming the first internal resistance to have a first value; electrically programming the second internal resistance to have a second value; and electrically programming the third internal resistance to have a third value. The first value is about 50 kiloohms, second value is about 100 kiloohms (e.g., more than the first value, or at least about twice the first value), and third value is about 5 kiloohms (e.g., less than the first value, or about one-tenth of the first value). As an example, the first internal resistance can have a value of at least 1000 ohms.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2 shows a circuit diagram of a programmable VCOM driver circuit with one or more internal resistors or resistances.
FIGS. 3A-3C show an equation and tables of operating conditions of the programmable VCOM driver circuit with one or more internal resistors or resistances.

DETAILED DESCRIPTION OF THE INVENTION

Figure 1A:
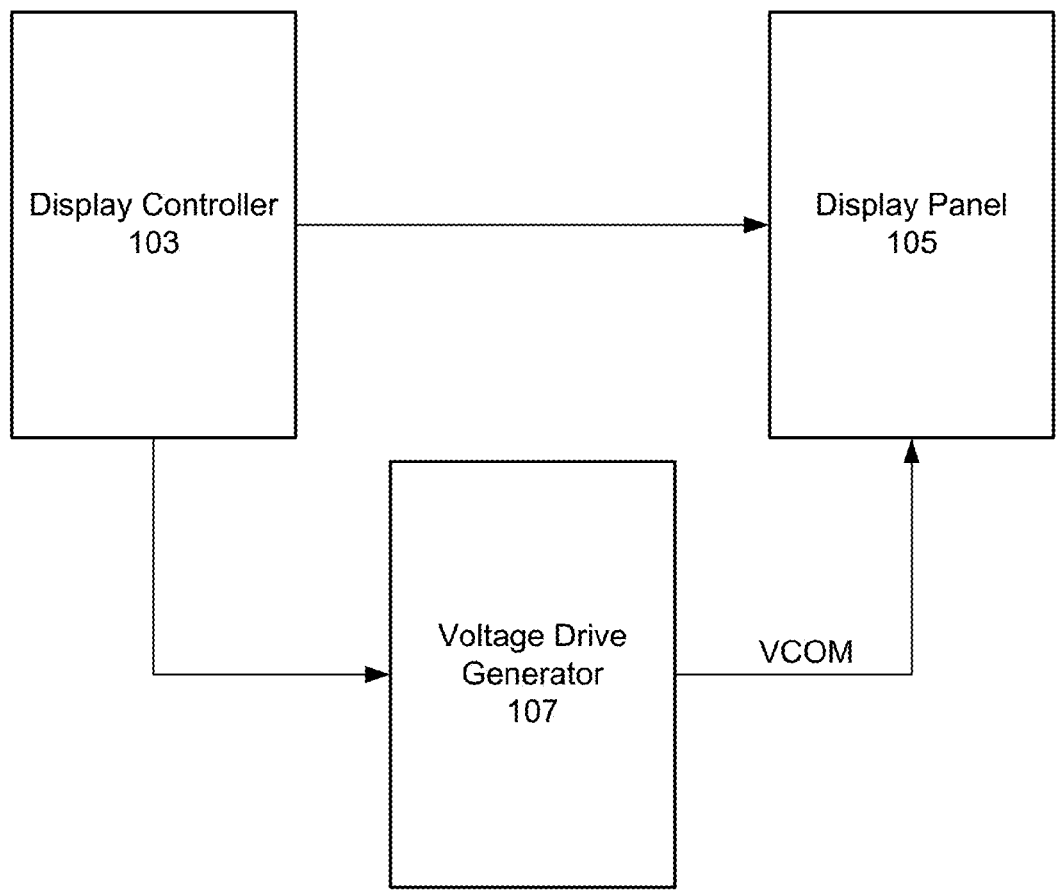
FIG. 1A shows a block diagram of a display system.

FIG. 1A shows a block diagram display system. This display system can be incorporated in computer monitors, televisions, instrument panels, aircraft cockpit displays, signage, laptop computers, video players, music players (e.g., Apple's iPod product family), gaming devices, cameras, clocks, watches, calculators, telephones, smartphones (e.g., Apple's iPhone product family, Google's Nexus product family, Samsung's Galaxy product family), tablets (e.g., Apple's iPad product family, Google's Nexus product family, or Samsung's Galaxy product family), and many other devices.

The system includes a display controller 103 that drives a display panel 105 and a voltage driver generator and a voltage drive generator 107, which also drives the display panel. The voltage drive generator can generates a reference voltage for the display panel.

Figure 1B:
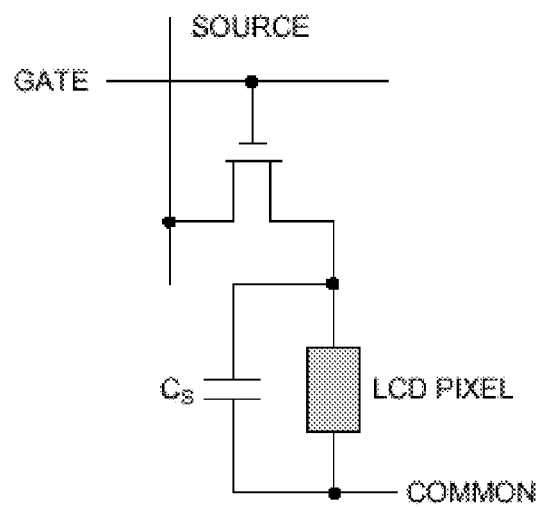
FIG. 1B shows a circuit diagram for a single LCD pixel.

The system can be an LCD display system, such as an active matrix thin-film transistor (TFT). FIG. 1B shows a circuit diagram for a single LCD pixel. Numerous pixels are arranged in an array to form a display panel. In an implementation, the voltage drive generator generates the VCOM reference voltage for pixels of the display panel.

Some common resolutions for panels includes 7680 by 4320 (e.g., 8K), 4096 by 2304 (e.g., 4K), 3840 by 2160 (e.g., 4K UHD), 2800 by 1800, 2560 by 1200, 2560 by 1400, 1600 by 1200, 1920 by 1080 (e.g., HD 1080), 1280 by 720 (e.g., 720p), 1136 by 640 (e.g., iPhone 5), 1280 by 768, 960 by 640 (e.g., iPhone 4S), 1024 by 768, 800 by 600, 800 by 480, 640 by 480, 480 by 320, and many more.

The LCD is panel includes glass, TFT array substrate, liquid crystal, polarizer, color filters, and other components to implement a TFT LCD. The drive electronics of a TFT activate the TFT array substrate, resulting in an induced electromagnetic field that affects the liquid crystal. The liquid crystal is twisted in response to the induced electric field, allowing light to shine through the glass sandwich. The light is modulated by the color filters to output the desired color.

In other implementations, the display panel can be of another LCD technology such as a passive-matrix LCD, super-twisted nematic (STN), double-layer STN (DSTN), or color-STN (CSTN). Or the display panel can use organic light emitted diode (OLED). Aspects of the invention can be applied to various display panel technologies.

A VCOM circuit outputs a VCOM voltage reference, typically for an LCD screen. LCD screens have an array of pixels constantly lit by a backlight. The constancy of the light removes the type of flicker usually associated with cathode ray tube (CRT) screens (phosphors pulsing with each refresh cycle). Instead, an LCD pixel has upper and lower plates with grooves cut perpendicular to each other as in. These grooves align the crystals to form channels for the backlight to pass through to the front of the panel. The amount of light emitted depends upon the orientation of the liquid crystals and is proportional to the applied voltage.

Referring to FIG. 1B, the gate voltage acts as a switch and is commonly amplified to become −5 volts to 20 volts. The video source, typically ranging from 0 volts and 10 volts, provides the intensity information that appears across the pixel. The bottom of the pixel is commonly connected to the backplane of the panel. The voltage at this node is VCOM.

While this set-up is functional, it reduces panel lifetime. Assuming the VCOM voltage is at ground, the voltage across the pixel varies from 0 volts to 10 volts. Assuming an average of 5 volts, there is substantial DC voltage across each pixel. This DC voltage causes charge storage, or memory. In the long term, it is a form of aging, degrading the pixels by electroplating ion impurities onto one of the electrodes of the pixel. This contributes to image retention, commonly known as a sticking image.

The construction of the LCD panel is generally symmetrical and either a positive or a negative voltage can be used to align the crystals. A technique is to adjust the common voltage (VCOM) to a midpoint of the video signal (e.g., 10/2, which is 5 volts) or other desired voltage level (e.g., ⅔, ¾, or other percentage of the maximum signal voltage). Now the video signal swings above and below the common voltage (VCOM), creating a net zero effect on the pixel. This net zero effect on the liquid crystal eliminates the aging and image retention issues. A tradeoff for this technique is resolution, since the video signal travels 5 volts to full brightness instead of the entire 10-volt range.

The VCOM voltage should be set very precisely (e.g., midpoint or ½ of the video signal, ⅔ of signal voltage, or other value) to avoid flicker. To illustrate why a panel will flicker, let's assume that due to manufacturing of the panel the VCOM is 5.5 volts. If the video signal swings between 0 volts and 10 volts, the full-scale voltage will be different on each field. On one field, the full-scale voltage will be 4.5 volts and on the other, the full-scale voltage will be 5.5 volts. This difference in full-scale voltage translates to a difference in intensity, experienced as flicker.

Due to the variations in construction of each panel, the optimal VCOM voltage can differ from panel to panel or across a single panel. It is important to be able to set the VCOM precisely and also be able to change it as needed to work optimally with a particular panel.

In the specific implementation shown, the display controller and voltage drive generator are circuits residing on separate integrated circuits or different semiconductor substrates. But in other implementation, some or all components of the voltage drive generator can be incorporated into the drive controller integrated circuit (or alternatively, integrated within the display panel).

Figures 2, 3B, 3C:
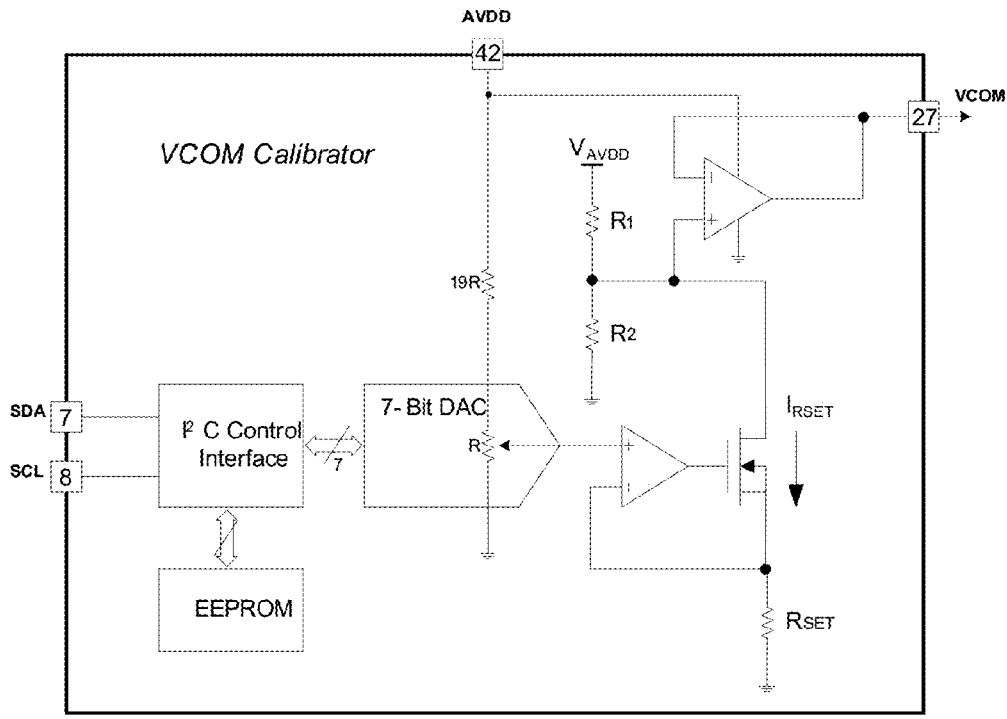

FIG. 2 shows a VCOM generator and calibrator circuit. This circuitry can be part of the display system of figure, such as in the voltage drive generator (or display controller). The circuit has SDA 7 and SCL 8 inputs, a VCOM output 27, and a power input AVDD 42.

SDA and SCL inputs connect to an I2C control interface. The I2C control interface connects to an EEPROM (electrically erasable program read only memory) which is a nonvolatile memory storage. The I2C control interface connects via a 7-bit bus to a 7-bit digital-to-analog converter (DAC).

The I2C bus interface (or Inter-Integrated Circuit) is a multi-master serial single-ended computer bus developed by Philips that is used to attach low-speed peripherals to a motherboard, embedded system, cellphone, or other electronic device. The I2C specification can be found at the NXP Semiconductor Web site and documented in Philips Semiconductors, "The I2C-Bus Specification, Version 2.1," January 2000 (document order no. 9398 383 40011). Documents on the I2C interface are incorporated by reference.

Although a specific implementation has a 7-bit DAC, other implementations can use a DAC have less than 7 bits (e.g., 1, 2, 3, 4, 5, or 6 bits) or more than 7 bits (e.g., 8, 10, 12, 14, 16, 18, 20, 24, 32, or other number of bits). AVDD connects through a resistor or resistance 19R to provide power the DAC. The DAC has an internal resistor or resistance R that is connected to a first operational amplifier or op amp.

AVDD supplies power to the first op amp (not shown) and to a second op amp. VCOM is connected to a negative (−) input of the second op amp and also an output of the second op amp. A positive (+) input of the second op amp is connected to a bias voltage generated by a divider of resistors or resistances R1 and R2. This bias voltage may also be referred to as a DVR output. R2 is also connected to ground. A node between R1 and R2 is connected to a drain node of a transistor, which has a current IRSET passing through it. A source node of the transistor is connected to a negative (−) input of the first op amp and to a resistor or resistance RSET. RSET is also connected to ground.

In an implementation, the transistor is an n-channel or NMOS transistor, but in other implementation, the transistor can be a p-channel or PMOS transistor.

Some existing digitally variable resistors (DVR), VCOM generators, and programmable VCOM (PVCOM) integrated circuits include Integrated Memory Logic's (IML) iML7976 and iML7972. Data sheets, white papers, and other public documentation (such as available as the IML Web site) on these products are incorporated by reference. The circuitry described in this patent application can be used in such DVR or PVCOM products.

In an implementation, 7-bit current-mode DVR and PVCOM circuits use three external resistors: two resistors (e.g., R1 and R2) to set an initial point or bias voltage for VCOM and one resistor (e.g., RSET) set current for DAC least significant bit (LSB). The PVCOM is programmable via the DAC, which can adjust its output. By adjusting the DAC output (7-bit precision), the voltage is varied across the RSET resistor. This is used to in production to control the quality of the panel. Also existing 7-bit DVR and PVCOMs need accurate external resistor for current setting, which is expensive.

Current 10-bit DVR and PVCOM integrated circuits (ICs) are not compatible with the existing production equipment. The DVR is used to adjust the LCD panel, on a panel to panel base. Each single panel is adjusted in production, looking for best screen performance (e.g., low flicker). The machines used in the factory have a 7-bit I2C interface protocol. It is not practical for customers to change the production machines. The setting of the resistors is made off-line (IC level) and is the same for all the LCD panels (at least for one model or size). So in production, on the finished board level, the customer only needs to adjust the 7-bit DAC for optimal screen accuracy.

In an implementation, resistors or resistances R1, R2, and RSET are fabricated on the same integrated circuit as the other components of the DVR or PVCOM. External resistors are not used. By integrating the resistors in the 7-bit DVR or PVCOM it is possible to reduce the number of external components, reduce the number of pins, while increasing the accuracy of the DVR or PVCOM. When the actual LSB depends only on ratios of internal resistors, it can be made very accurate and independent of temperature.

The internal resistors or resistances can be formed using a technique used to create a resistance within an integrated circuit, such as using passive or active components, or a combination of these. For example, the resistance can be formed using a track of resistive material (e.g., polysilicon, diffusion, or a combination of materials chained together), transistor, or diode. As internal resistors or resistances, these are formed on the same integrated circuit or semiconductor substrate as other components such as the DAC, operational amplifiers, and transistor.

To provide flexibility to the customer, the current setting resistor for the DAC is programmable. The customer can choose between several different values, maintaining the flexibility of the external approach. This implementation is compatible with the machines used currently in production for LCD panels.

Programmable resistors or resistances can be provided by way of circuitry that alters resistance values based on memory or storage elements such as programmable fuses, links, antifuse, flip flops, memory cells (e.g., RAM, SRAM, PROM, EPROM, or EEPROM), and many others. Depending on the programming of the memory or storage elements, the resistor or resistors (R1, R2, and RSET) can be varied. The resistances can be selected by electrically programming the device (e.g., by using high voltages or a voltage or programming sequence to select a resistance value).

R1 and R2 are typically about equal (so that a starting voltage of VCOM is about 50 percent of AVDD), but these resistor can have different. In a specific implementation, the resistor divider is set to ⅔ or 66 percent of AVDD (i.e., R2 is 2*R1). The typically value of the resistances is typically in the order of several kiloohms. It is defined by a design trade off between low current consumption and noise immunity. A specific design uses about 50 kiloohms and 100 kiloohms. Other design use combinations of 10 and 20 kiloohms, 20 and 40 kiloohms, 25 and 50 kiloohms, 30 and 60 kiloohms, 60 and 120 kiloohms, 75 and 150 kiloohms, and other combinations. Other specific designs use R1 equal to R2 with a value of 10 kiloohms, 20 kiloohms, 30 kiloohms, 50 kiloohms, 100 kiloohms, or other values.

The RSET range is typically between 1 kiloohm and 20 kiloohms (FIG. 3C). The value is selected by the customer depending if they want accuracy (e.g., RSET will be selected to a relatively higher value) or a quick convergence to the desirable point (RSET will be selected to be a relatively lower value).

In an implementation, the values of the integrated resistors are programmable to have a value as discussed above. For example, R1 is programmable to be any one of 10, 20, 30, 40, 50, 60, or 100 kiloohms, or any combination of these. R2 is programmable to be any one of 10, 20, 30, 40, 50, 60, or 100 kiloohms, or any combination of these. RSET is programmable to be any one of 1, 3, 5, 7.5, 10, 12.5, 15, or 20 kiloohms, or any combination.

R1 and R2 are programmable that they can have an R1/R2 ratio that can change between about ½ to about 2 (which would occur in very specific circumstances). In other implementations, the R1/R2 ratio is programmable to vary between about ½ to about 1. RSET programmability varies between about 1000 ohms to about 20 kiloohms.

Some benefits include of integrated resistors include: reduction of number of external components in DVR and PVCOM (three component less); reduction of number of pins in DVR and PVCOM (potentially down to one pin, a VCOM output); improvement of accuracy (depending only on ratio of resistors, i.e., very accurate in CMOS processes); increased flexibility (use of programmable resistor for current setting); and backward compatible (can use existing production tools and provide same performance).

Three resistors (R1, R2, and RSET) are integrated into the integrated circuit, so that external resistors are not used. By doing so the number of external components is reduced, and so is the cost. This also allows to reduce the number of pins of the integrated circuit, because three pins can be eliminated: (i) connection to RSET, (ii) connection for positive input of op amp (typically connected externally to R1 and R2), and (iii) output of DVR (typically connected externally to the positive input of the op amp).

In various other implementations, only one or any combination of resistors R1, R2, and RSET can be integrated in the integrated circuit. For example, only R1 is integrated into the integrated circuit and R2 and RSET remain external to the integrated circuit. Only R2 is integrated into the integrated circuit and R1 and RSET remain external to the integrated circuit. Only RSET is integrated into the integrated circuit and R1 and R2 remain external to the integrated circuit. In further implementations, R1 and R2 are integrated while RSET is external. R1 and RSET are integrated while R2 is external. R2 and RSET are integrated while R1 is external.

Depending on the number of resistors integrated, the number of pins that are reduced by integrated one or more resistors R1, R2, and RSET can be up to three, fewer than three, or more than three.

Further, the accuracy of the system is not affected, but rather improved by use of internal resistors. Since the final voltage depends only on ratio of internal resistors, the ratio can be made very precisely and is inherently independent from temperature.

In FIGS. 3A-3C, see equation and tables showing operating conditions for the circuitry. FIG. 3A gives an equation of a relationship between AVDD, R1, R2, and RSET. In a specific implementation (refer to FIG. 3B), AVDD is about 12.2 volts, R1 is about 50 kiloohms, R2 is about 100 kiloohms, and VCOM (max) is about 8.1 volts, which is about 0.677 of AVDD. A default value for RSET can be about 5 kiloohms. For other values of RSET, values are provided in the table in FIG. 3C.

The conventional architecture (external resistors), does not match as well as this invention, and therefore has worse accuracy. Moreover, the temperature variation depends on the resistor used and on their position on the board and therefore is less accurate than in the invention.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A device comprising:
   a digital-to-analog (DAC) converter circuit, wherein the digital-to-analog converter circuit comprises 7 bits;
   a first operational amplifier circuit, comprising a first input and a second input, wherein the first input is coupled to the digital-to-analog converter circuit;
   a second operational amplifier circuit, comprising a first input and a second input, wherein the first input is coupled to an output of the second operational amplifier circuit and a voltage output of the integrated circuit; and
   a first internal impedance, coupled between a first supply voltage and a voltage bias node.

2. A device comprising:
   a digital-to-analog (DAC) converter circuit;
   a first operational amplifier circuit, comprising a first input and a second input, wherein the first input is coupled to the digital-to-analog converter circuit;
   a second operational amplifier circuit, comprising a first input and a second input, wherein the first input is coupled to an output of the second operational amplifier circuit and a voltage output of the integrated circuit;
   a first internal impedance, coupled between a first supply voltage and a voltage bias node
   a second internal impedance, coupled between the voltage bias node and a second supply voltage line, wherein the voltage bias node is coupled to the second input of the second operational amplifier circuit;
   a transistor, coupled between the voltage bias node and the second input of the first operational amplifier circuit; and
   a third internal impedance, coupled between the second input of the first operational amplifier circuit and the second supply voltage line, wherein the third internal impedance is electrically programmable in a range from about 1 kiloohm to about 20 kiloohms.

3. A device comprising:
   a digital-to-analog (DAC) converter circuit;
   a first operational amplifier circuit, comprising a first input and a second input, wherein the first input is coupled to the digital-to-analog converter circuit;
   a second operational amplifier circuit, comprising a first input and a second input, wherein the first input is coupled to an output of the second operational amplifier circuit and a voltage output of the integrated circuit; and a first internal impedance, coupled between a first supply voltage and a voltage bias node, wherein the first internal impedance has a value of at least one of about 50 kiloohms or 100 kiloohms.

4. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit; and
a first internal impedance, coupled between a first supply voltage and a voltage bias node, wherein the first supply voltage has a value about 12 volts.

5. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit; and
a first internal impedance, coupled between a first supply voltage and a voltage bias node, wherein the first internal impedance is programmable to have a plurality of impedance values.

6. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit;
a first internal impedance, coupled between a first supply voltage and a voltage bias node
a second internal impedance, coupled between the voltage bias node and a second supply voltage line, wherein the voltage bias node is coupled to the second input of the second operational amplifier circuit; and
a transistor, coupled between the voltage bias node and the second input of the first operational amplifier circuit, wherein the second internal impedance is programmable to have a plurality of impedance values.

7. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit;
a first internal impedance, coupled between a first supply voltage and a voltage bias node
a second internal impedance, coupled between the voltage bias node and a second supply voltage line, wherein the voltage bias node is coupled to the second input of the second operational amplifier circuit;
a transistor, coupled between the voltage bias node and the second input of the first operational amplifier circuit; and
a third internal impedance, coupled between the second input of the first operational amplifier circuit and the second supply voltage line, wherein the third internal impedance is programmable to have a plurality of impedance values.

8. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit;
a first internal impedance, coupled between a first supply voltage and a voltage bias node
a second internal impedance, coupled between the voltage bias node and a second supply voltage line, wherein the voltage bias node is coupled to the second input of the second operational amplifier circuit;
a transistor, coupled between the voltage bias node and the second input of the first operational amplifier circuit; and
a third internal impedance, coupled between the second input of the first operational amplifier circuit and the second supply voltage line, where a connection to the third internal impedance is not made available via an external pin to the integrated circuit.

9. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit; and
a first internal impedance, coupled between a first supply voltage and a voltage bias node, where a connection to the second input node of the second operational amplifier circuit is not made available via an external pin to the integrated circuit.

10. A device comprising:
a digital-to-analog (DAC) converter circuit;
a first operational amplifier circuit, comprising a first input and a second input, wherein the first input is coupled to the digital-to-analog converter circuit;
a second operational amplifier circuit, comprising a first input and a second input, wherein the first input is coupled to an output of the second operational amplifier circuit and a voltage output of the integrated circuit; and
a first internal impedance, coupled between a first supply voltage and a voltage bias node, wherein a connection to an output of the digital-to-analog converter circuit is not made available via an external pin to the integrated circuit.

11. The device of claim 1 wherein the first input of the first operational amplifier circuit is a positive input.

12. The device of claim 1 wherein the first input of the second operational amplifier circuit is a negative input.

13. A method comprising:
providing a digital-to-analog (DAC) converter circuit, wherein the digital-to-analog converter circuit comprises 7 bits;
providing a first operational amplifier circuit;
coupling a first input of the first operational amplifier to the digital-to-analog converter circuit;
providing a second operational amplifier circuit; and
coupling a first input of the second operational amplifier to an output of the second operational amplifier circuit and a voltage output.

14. The method of claim 13 comprising:
providing a first internal impedance; and
coupling the first internal impedance between a first supply voltage and a voltage bias node;
providing a second internal impedance;
coupling the second internal impedance between the voltage bias node and a second supply voltage line; and
coupling the voltage bias node to a second input of the second operational amplifier circuit.

15. The method of claim 14 comprising:
providing a transistor;
coupling the transistor between the voltage bias node and a second input of the first operational amplifier circuit;
providing a third internal impedance; and
coupling the third internal impedance between the second input of the first operational amplifier circuit and the second supply voltage line.

16. A method comprising:
providing a digital-to-analog (DAC) converter circuit;
providing a first operational amplifier circuit;
coupling a first input of the first operational amplifier to the digital-to-analog converter circuit;
providing a second operational amplifier circuit;
coupling a first input of the second operational amplifier to an output of the second operational amplifier circuit and a voltage output;
providing a first internal impedance;
coupling the first internal impedance between a first supply voltage and a voltage bias node;
providing a second internal impedance;
coupling the second internal impedance between the voltage bias node and a second supply voltage line;
coupling the voltage bias node to a second input of the second operational amplifier circuit providing a transistor;
coupling the transistor between the voltage bias node and a second input of the first operational amplifier circuit;
providing a third internal impedance;
coupling the third internal impedance between the second input of the first operational amplifier circuit and the second supply voltage line;
electrically programming the first internal impedance to have a first value;
electrically programming the second internal impedance to have a second value; and
electrically programming the third internal impedance to have a third value.

17. The device of claim 16 wherein the digital-to-analog converter circuit comprises 7 bits.

18. The device of claim 1 comprising:
a second internal impedance, coupled between the voltage bias node and a second supply voltage line, wherein the voltage bias node is coupled to the second input of the second operational amplifier circuit; and
a transistor, coupled between the voltage bias node and the second input of the first operational amplifier circuit.

19. The device of claim 18 comprising:
a third internal impedance, coupled between the second input of the first operational amplifier circuit and the second supply voltage line.

20. The device of claim 5 wherein the digital-to-analog converter circuit comprises 7 bits.

* * * * *